United States Patent
Verhoeven et al.

(12) 
(10) Patent No.: US 6,410,928 B1
(45) Date of Patent: Jun. 25, 2002

(54) EUV ILLUMINATION SYSTEM

(75) Inventors: Jan Verhoeven, Kockengen; Boris Lastdrager, Amsterdam; Adriaan Tip, Castricum; Dirk K. G. De Boer, Eindhoven, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/460,938

(22) Filed: Dec. 14, 1999

(30) Foreign Application Priority Data

Dec. 14, 1998 (EP) .............................. 98204237

(51) Int. Cl.[7] .............................. A61N 5/00; G21G 5/00
(52) U.S. Cl. ...................... 250/492.2; 430/296
(58) Field of Search ................... 430/396, 296, 430/311, 942; 355/53; 378/34, 43; 250/492.2, 584, 491.1

(56) References Cited

U.S. PATENT DOCUMENTS

| | | | |
|---|---|---|---|
| 5,144,363 A | 9/1992 | Wittekoek et al. | 355/53 |
| 5,153,898 A | 10/1992 | Suzuki et al. | 378/34 |
| 5,191,200 A | 3/1993 | Van Der Werf et al. | 250/201.4 |
| 6,280,906 B1 * | 8/2001 | Braat et al. | 430/296 |

FOREIGN PATENT DOCUMENTS

EP 0779528 A2 6/1997
WO 9733204 A1 9/1997

OTHER PUBLICATIONS

"Front–end Design Issues in Soft–X–Ray Projection Lithography", by Natale M. Ceglio et al, Applied Optics, vol. 32, No. 34, Dec. 1, 1993.

"X–Ray Cerenkov Radiation. Theory and Experiment", by V.A. Bazylev et al, Sov. Phys. JETP vol. 54, No. 5, Nov. 1981.

"X–Ray Narrow–Line Transition Radiation Source Based on Low–Energy Electron Beams Traversing a Multiklayer Nanostructure", by A.E. Kaplan et al., The American Physical Society, vol. 52, No. 6, Dec. 1995.

* cited by examiner

*Primary Examiner*—Jack Berman
*Assistant Examiner*—Johnnie L Smith, II
(74) *Attorney, Agent, or Firm*—Aaron Waxler

(57) ABSTRACT

An EUV illumination system comprises an EUV radiation source unit (1) and at least one EUV radiation-reflecting mirror (10), which mirror comprises a multilayer structure of first layers (12) of a first material alternating with second layers (13) of a second material, and which radiation source unit comprises an electron source (2) for supplying an electron beam (EB) and a medium (3) which converts the electron beam into a beam of photons (IB). As the medium (3) comprises at least one material that is equal to one of the materials of the mirror multilayer structure, the photon beam (IB) has a relatively large intensity.

11 Claims, 3 Drawing Sheets

EUV ILLUMINATION SYSTEM

BACKGROUND OF THE INVENTION

The invention relates to an illumination system for illuminating an object with EUV radiation, which system comprises an EUV radiation source unit and at least one EUV radiation-reflecting mirror having a multilayer structure of first layers of a first material alternating with second layers of a second material.

The invention also relates to a lithographic apparatus provided with such an illumination system, and to a method for manufacturing devices.

A lithographic apparatus is used, inter alia, in the manufacture of integrated electronic circuits, or ICs, for imaging an IC mask pattern, present in a mask, each time on a different IC area of a substrate. This substrate, which is coated with a radiation-sensitive layer, provides space for a large number of IC areas. The lithographic apparatus may also be used in the manufacture of other devices like, for example, liquid crystalline display panels, integrated or planar optical systems, charge-coupled detectors (CCDs) or magnetic heads.

Since it is desirable to accommodate an increasing number of electronic components in an IC, increasingly smaller details, or line widths, of IC patterns must be imaged. Thus, increasingly stricter requirements are imposed on the imaging quality and the resolving power of the projection system which is usually a lens system in the current lithographic apparatuses. The resolution, which is a measure of the smallest detail which can still be imaged satisfactorily, is proportional to $\lambda/NA$, in which $\lambda$ is the wavelength of the imaging, or projection, beam and NA is the numerical aperture of the projection system. To increase the resolution, the numerical aperture may, in principle, be increased and/or the wavelength may be reduced. In practice, an increase of the numerical aperture, which is currently already fairly large, is not very well possible because this reduces the depth of focus of the projection lens system, which is proportional to $\lambda/NA^2$, while it becomes too difficult to correct for the required image field.

The requirements to be imposed on the projection lens system may be alleviated, or the resolution may be increased, while maintaining these requirements, if a step-and-scanning lithographic apparatus is used instead of a stepping lithographic apparatus. In a stepping apparatus, a full-field illumination is used, i.e. the entire mask pattern is illuminated in one operation and imaged as a whole on an IC area of the substrate. After a first IC area has been illuminated, a step is made to a subsequent IC area, i.e. the substrate holder is moved in such a way that the next IC area is positioned under the mask pattern, whereafter this area is illuminated, and so forth until all IC areas of the substrate are provided with the mask pattern. In a step-and-scanning apparatus, only a rectangular or circular segment-shaped area of the mask pattern and hence also a corresponding sub-area of a substrate IC area is each time illuminated, and the mask pattern and the substrate are synchronously moved through the illumination beam, while taking the magnification of the projection lens system into account. A subsequent area of the mask pattern is then each time imaged on a corresponding sub-area of the relevant IC area of the substrate. After the entire mask pattern has been imaged on an IC area in this way, the substrate holder performs a stepping movement, i.e. the beginning of the next IC area is moved into the projection beam and the mask is set to its initial position whereafter said next IC area is scan-illuminated via the mask pattern.

If even smaller details are to be imaged satisfactorily with a stepping or a step-and-scanning lithographic apparatus, it is still possible to reduce the wavelength of the projection beam. In the current stepping and step-and-scanning apparatuses, deep UV (DUV) radiation, i.e. radiation having a wavelength of the order of several hundred nanometers, for example 245 nm or 193 nm from, for example, an excimer laser is already used. Another possibility is the use of extreme UV (EUV) radiation, also referred to as soft X-ray radiation, with a wavelength in the range of several nm to several tens of nm. Extremely small details, of the order of 0.1 $\mu$m or less, can be satisfactorily imaged with such a radiation.

Since there is no suitable material with which lenses can be made available for EUV radiation, a mirror projection system must be used for imaging the mask pattern on the substrate, instead of a hitherto conventional projection lens system. For forming a suitable illumination beam from the radiation of the radiation source unit, mirrors are also used in the illumination system.

The article "Front-end design issues in soft X-ray projection lithography" in Applied Optics, vol. 32, no. 34, Jan. 12, 1993, pp. 7050–56 describes a lithographic projection apparatus in which EUV radiation is used. The illumination system of this apparatus comprises three mirrors and the imaging, or projection, system comprises four mirrors. The radiation source unit comprises a high-power laser generating a plasma in a medium emitting EUV radiation. This radiation source unit is known as Laser Produced Plasma Source (LPPS). Said medium may be a solid, a liquid or a gaseous medium, and the generated EUV radiation has a wavelength of 13 nm.

It is a great problem in EUV lithographic apparatuses to illuminate the substrate with a sufficiently high intensity. A first cause of this problem is that radiation sources emitting radiation at the envisaged wavelength, in the range of 13 nm, are not very efficient and only supply a limited quantity of radiation. Moreover, the mirrors are considerably less than 100% reflecting. Each of these mirrors has a multilayer structure whose composition is adapted as satisfactorily as possible to the wavelength of the projection beam used. Examples of such multilayer structures are described in U.S. Pat. No. 5,153,898. A multilayer structure which is often referred to in literature is the structure consisting of silicon layers alternating with molybdenum layers. For radiation supplied by a plasma source, these layers theoretically have a reflection of the order of 73% to 75%, but in practice, the reflection is currently not larger than 65%. When said number of seven mirrors is used with a reflection of 68% each, only 6.7% of the radiation emitted by the source reaches the substrate. In practice, this means for a lithographic apparatus that the illumination time must be relatively long so as to obtain the desired quantity of radiation energy on an IC area of the substrate, while for a scanning apparatus the scanning rate is relatively short. However, it is essential for these apparatuses that the scanning rate is as high as possible and the illumination time is as short as possible so that the throughput, i.e. the number of substrates which can be illuminated per unit of time, is as high as possible.

SUMMARY OF THE INVENTION

It is an object of the present invention to provide an illumination system in accordance with a novel concept, which illumination system is particularly, but not exclusively suitable for use in a lithographic apparatus. This illumination system is characterized in that the radiation source unit is provided with a medium bombarded by an electron beam, which medium comprises at least a material which is equal to one of the materials of said mirror.

As regards the wavelength, the invention provides an ideal combination of radiation source and mirror. Since the medium bombarded by the electron beam comprises the same material as one of said first and second layers of the mirror, the radiation source unit emits EUV radiation at the wavelength for which the mirror is maximally reflecting. For this wavelength, the reflection of the mirror is now 78% instead of said theoretical 73% to 75%, hence 3% to 5% larger. For a lithographic apparatus with seven mirrors, this means that 17.6% of the radiation emitted by the source can reach the substrate instead of 11% in the case where the reflection of the mirrors is 73%, which is a gain factor of 1.6. The radiation source unit of the novel illumination system supplies a radiation intensity which is comparable with that of an LPPS, but can be given a more compact design. Moreover, this radiation source unit is cleaner, i.e. the medium does not release particles which may be deposited on the mirrors and contaminate them.

Different radiation sources may be used within the concept of the invention. A first embodiment of the illumination system is characterized in that the medium of the radiation source unit consists of a single material which emits Cherenkov EUV radiation upon electron beam bombardment.

As described in the article by V. A. Bazylev et al. "X-ray Cherenkov radiation. Theory and experiment" in Sov. Phys. Jetp 54 (1981) page 884, Cherenkov radiation is produced if a material is bombarded with electrons whose velocity is larger than the phase velocity of the Cherenkov radiation in the medium. This article comprises a theoretical discourse about the Cherenkov radiation and states the conditions under which this radiation may be produced. Generally, a large change of the dielectric constant occurs for a material around the molecular absorption edges of the material. If this material is bombarded with a high energetic electron beam, the intensity of the Cherenkov radiation has a maximum at that energy at which the dielectric constant has a minimum. The selection of the absorption edge is determined by the desired wavelength of the Cherenkov radiation. The Bazylev article states carbon as an example of a solid-state medium in which Cherenkov radiation can be generated. Although the use of the radiation in a lithographic apparatus is mentioned, the use of silicon as a medium for generating the radiation is not mentioned. Moreover, the energy of the electrons is of the order of 1 GeV in the Bazylev article, and the generated Cherenkov radiation is hard X-ray radiation, not soft X-ray radiation or EUV radiation.

A second embodiment of the illumination system is characterized in that the medium of the radiation source unit comprises a multilayer structure of said first and second materials which emits EUV transition radiation upon electron beam bombardment.

As described in the article by A. E. Kaplan et al. "X-ray narrow-line transition radiation source based on low-energy electron beams traversing a multilayer nanostructure" in Phys. Rev. E 52 (1995) page 6795, transition radiation is produced if an electron beam whose electrons have an energy of the order of 10 MeV is passed through the transition between two materials having different dielectric constants. Also when generating transition radiation, use is made of the large change of the dielectric constant occurring around a molecular absorption edge. The radiation source unit described in the Kaplan article supplies hard X-ray radiation and is intended as a replacement for a synchrotron. The Kaplan article is limited to a theoretical discourse about the radiation source unit and does not describe a mirror system for further guiding the generated radiation and forming a suitable radiation beam.

A preferred embodiment of the illumination system using a Cherenkov radiation source is characterized in that the medium consists of silicon, and in that the first and the second material of the mirrors are silicon and molybdenum, respectively.

When using silicon as a medium, radiation having an energy of 99.7 eV and a wavelength of 12.44 nm is produced. For this wavelength, a mirror with silicon and molybdenum layers has a maximal reflection. Cherenkov radiation of the same wavelength is obtained by bombarding the Si medium with electrons having an energy of several MeV.

A preferred embodiment of the illumination system using a transition radiation source is characterized in that the materials of the medium are silicon and molybdenum.

The transition radiation having a wavelength of 12.44 nm is obtained by bombarding the Si/Mo transition(s) with electrons having an energy of several tens of MeV.

The invention also relates to a lithographic projection apparatus comprising an illumination system, a mask holder for accommodating a mask, a substrate holder for accommodating a substrate, and a mirror projection system for imaging a mask pattern, present in the mask, on the substrate. This apparatus is characterized in that the illumination system is a system as described hereinbefore.

This projection apparatus is further preferably characterized in that the mirrors of the mirror projection system have the same multilayer structure as the mirrors of the illumination system.

Optimal use is then made of the inventive idea.

These and other aspects of the invention are apparent from and will be elucidated, by way of non-limitative example, with reference to the embodiments described hereinafter.

DESCRIPTION OF THE PREFERRED EMBODIMENTS

Figure 1:
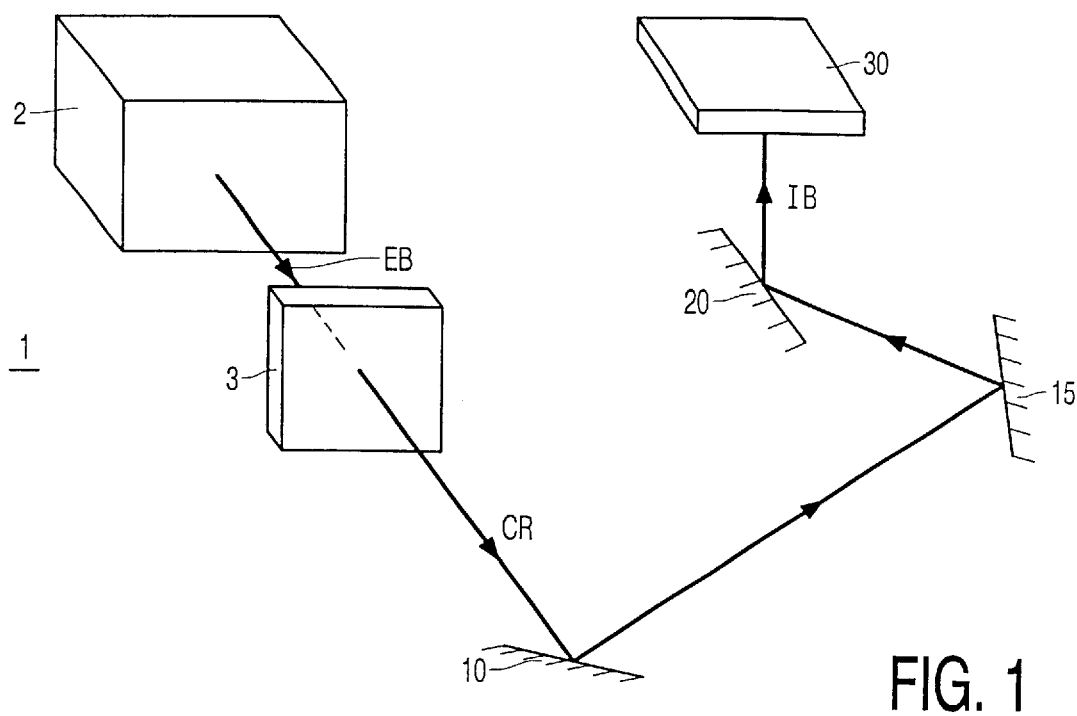
FIG. 1 shows a first embodiment of the illumination system according to the invention.

In FIG. 1, the radiation source unit is denoted by the reference numeral 1. This unit consists of an electron source 2 and a medium 3 on which the electron beam EB emitted by the source is incident. The electron source comprises an electron generator and a linear electron accelerator (LINEAC). In the medium 3, optical Cherenkov radiation having a given wavelength is generated by the electron beam if the electrons have a velocity which is larger than the phase velocity of the optical radiation in the medium. To this end, the dielectric constant ∈(E) of the medium should be larger than 1 for the relevant wavelength. For short-wave Cherenkov radiation, this condition is only fulfilled around the absorption edges of the medium. The Cherenkov radiation has a narrow wavelength band around the absorption edges. Generally, the dielectric constant of a material has a maximum value for a photon energy around the energy level of an absorption line or band of the material, namely at the low-energy side of such a band, as described in the above-mentioned article by Bazylev in Sov. Phys. Jetp, 54 (5), November 1981. The Cherenkov radiation thus exhibits a maximum for this photon energy.

The illumination system further comprises a plurality of mirrors 10, 15 and 20 receiving the Cherenkov radiation CR and forming a radiation beam IB which is suitable as an illumination beam for illuminating an object 30, for example, an IC mask whose mask pattern must be imaged on a semiconductor substrate which is not shown in FIG. 1. For the sake of simplicity, the mirrors are shown as plane mirrors, but actually these mirrors are concave or convex and have such a curvature that the beam IB has a cross-section which is desirable for the given circumstances. Notably the first mirror 10 has such a shape and is arranged at such a position with respect to the radiation source that it receives a maximal quantity of radiation from the radiation source unit and reflects it to the second mirror.

Figure 2:
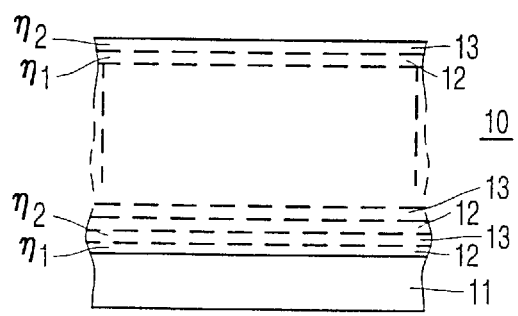
FIG. 2 shows a multilayer structure of the mirrors used in this system.

To obtain the desired reflection in the desired wavelength range, each mirror has a special layer structure as is shown diagrammatically in FIG. 2. This Figure shows a part of the mirror 10 in a cross-section. The mirror consists of a substrate 11 which is provided with a large number of alternating layers 12 and 13 having a refractive index $n_1$ and $n_2$, respectively. The mirrors 15 and 20 have the same layer structure. The layers 12 and 13 preferably consist of silicon and molybdenum, respectively, which materials have been proposed hereinbefore as very suitable materials for mirrors in EUV lithographic apparatuses. Mirrors having an Si—Mo layer structure have a good reflection for radiation at a wavelength in the range around 13 nm for which also satisfactory photoresists for EUV lithography are available, notably for radiation at a wavelength of 12.44 nm.

Figure 3:
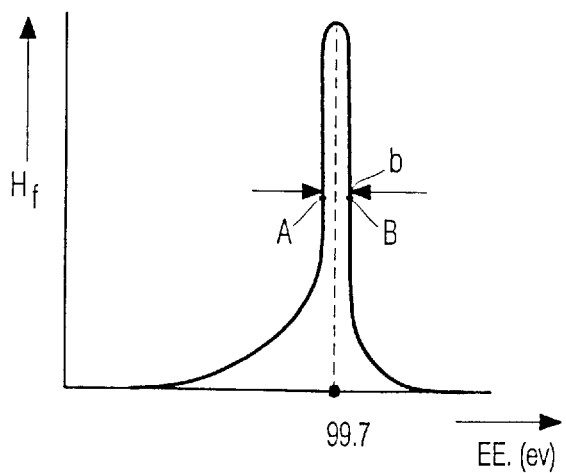
FIG. 3 shows the variation of the photon density as a function of the electron energy.

According to the invention, radiation of such a wavelength is obtained by using a thin wafer of silicon for the medium 3. The L absorption edge of this material is at 99.7 eV so that an electron beam EB generates Cherenkov radiation at a wavelength of 12.44 nm in this material. It is thereby achieved that a maximal part of the radiation supplied by the radiation source unit and received by the first mirror 10 can reach the object 30 to be illuminated. The Cherenkov radiation having a wavelength of 12.44 nm, which corresponds to a photon energy of 99.7 eV, can be obtained by bombarding the silicon wafer with electrons having an energy of several MeV. It has been theoretically proved that Cherenkov radiation is generated at a wavelength of 12.44 nm if an electron current of 100 μA and an electron energy of 3 MeV is passed through a silicon layer having a thickness of 10 μm. For the curve representing the number of photons N per energy level E for this radiation, which curve is shown in FIG. 3, it holds that the distance between the points A and B on the curve for which the number of photons is half the maximum number of photons in the center of the curve, also referred to as half-value width (FWHM), is 0.8 eV around the central value of 99.7 eV. This means that the wavelength spread of the radiation is less than 1% so that the radiation is satisfactorily monocromatic. The quantity of photons generated per second by the electron current of 100 μA is at least $10^{11}$. These photons are irradiated within a cone whose axis extends at an angle of approximately 8.4° to the direction of the electron beam EB. The half-value width (FWHM) of the apex angle of this cone, i.e. the angular distance between the directions for which the intensity is half the central intensity is approximately 1.4° so that the photon beam can be received, further guided and formed by mirrors which are not too large.

Figure 4:
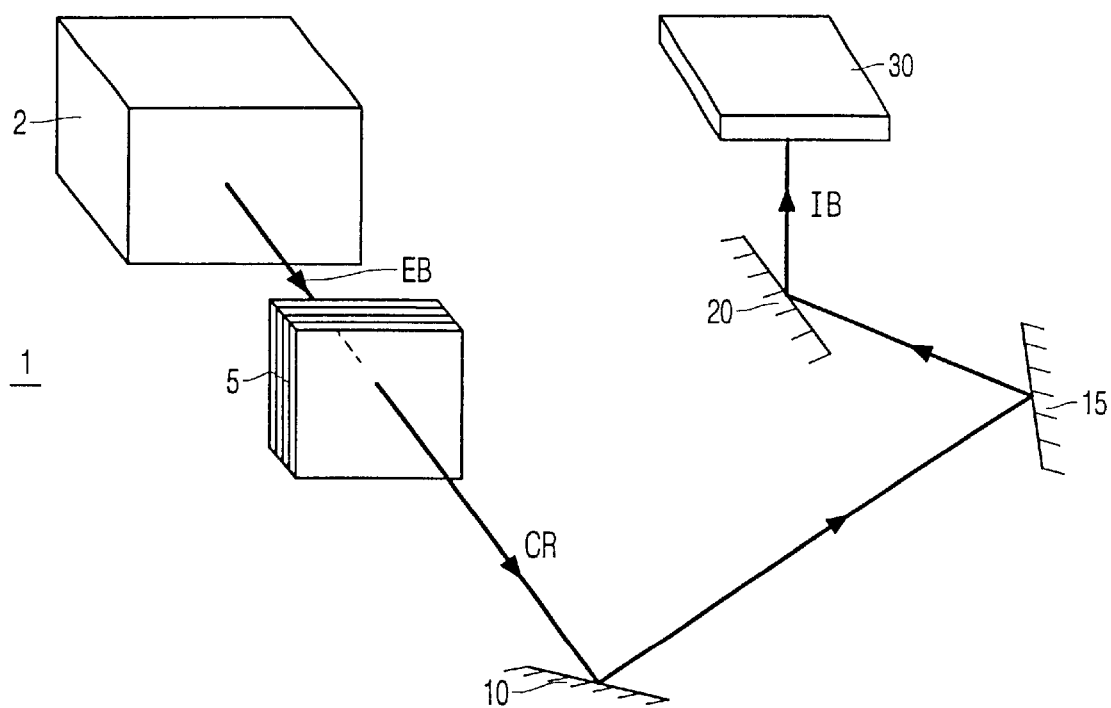
FIG. 4 shows a second embodiment of the illumination system according to the invention.
Figure 5:
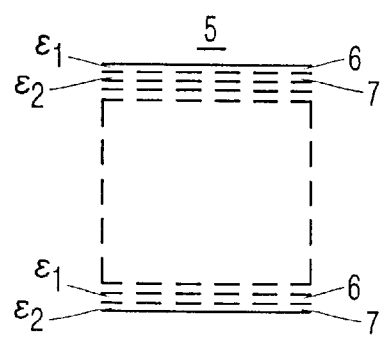
FIG. 5 shows the medium used in this embodiment.

FIG. 4 shows a second embodiment of the illumination system. This embodiment is distinguished from that in FIG. 1 in that a multilayer structure 5 is used as a medium instead of a silicon wafer. As is shown in FIG. 5, this structure consists of layers 6 which alternate with layers 7, the layers 6 having a different dielectric constant ($\in_1$) than the layers 7 ($\in_2$).

As described in the above-mentioned article by A. Kaplan in Phys. Rev. E 52 (6) December 1995, pp. 6795–6808, transition radiation TR can be generated by passing an electron beam with a sufficient energy through a number of transitions between a first material having a first dielectric constant and a second material having a second dielectric constant. Generally, transition radiation is generated if electrons are passed through a transition between a first layer of a first material and a second layer of a second material, which materials have different refractive indices, hence different dielectric constants. In principle, this transition radiation occurs in a large wavelength range. The material of the first layer is selected for its molecular absorption edges and for the wavelength of the radiation to be generated. It holds that with an increasing energy of the electrons, the wavelength of the generated radiation will be smaller. The energy level of the K, L or M absorption edge of the material of the first layer must correspond to the energy of the electrons. The K, L and M absorption edges are the extrema in the curve representing the variation of the atomic dispersion factor as a function of the frequency of the generated radiation. A strong change of the dielectric constant occurs around an absorption edge. The energy levels of the absorption edges of the material of the second layer must be sufficiently different from those of the material of the first layer, in other words, the two layers must mutually exhibit a sufficient optical contrast. The quantity of transition radiation which is generated is dependent on this contrast. Due to the anomalous variation of the dielectric constant around an absorption edge of a layer, the contrast with the other layer will be large at that area. Consequently, the quantity of generated radiation at the wavelength associated with this absorption edge is large.

By passing an electron beam through a series of transitions, hence through a series of first and second layers, the intensity of the transition radiation is increased due to the interference between the optical radiation components coming from the different transitions.

It is theoretically proved in the Kaplan article that, by using a large number of consecutive transitions, transition radiation can be obtained with a considerably lower energy of the electrons than when using only a single transition; instead of an electron energy of the order of 1 GeV, an electron energy of the order of 10 MeV is sufficient. The electron source can thus be implemented in a considerably simpler manner and at lower cost. The transition radiation source described by Kaplan is intended as an alternative to a synchrotron, hence for supplying hard X-ray radiation at a wavelength of the order of 1 nm or less. The article is limited to a theoretical discourse about the radiation source unit and does not explicitly deal with the optical system of which this unit may form part.

For generating transition radiation, it is not necessary to satisfy the requirement that the velocity of the electrons in the medium is larger than the phase velocity of the generated radiation, which requirement must be satisfied when generating Cherenkov radiation.

According to the invention, silicon and molybdenum are used as materials for the layers 6 and 7, respectively, in FIGS. 4 and 5 for obtaining soft X-ray radiation. Other materials instead of molybdenum may be used alternatively. Mo, Zr or Nb are preferred due to their high radiation output. Mo has the further advantage that it can be easily vapor-deposited. By bombarding the Si/Mo multilayer structure with a beam of electrons having an energy of the order of 10 MeV, transition radiation is generated at a wavelength of 12.44 nm, for which wavelength the mirrors 10, 15 and 20 of the illumination system have the maximal reflection. The intensity of the transition radiation is comparable with that of the Cherenkov radiation.

The reflection by the multilayer structure of the mirrors 10, 15 and 20 is based on the interference of the radiation components coming from the different transitions. The reflection per transition is determined by the optical contrast, hence the difference between the refractive indices, or dielectric constants, of the two layers associated with the relevant transition. An important aspect of the combination according to the invention is that, due to the anomalous variation of the dielectric constants in the layers of the radiation source, the radiation generated by this source also has a higher contrast at the transitions within the multilayer structure of the mirrors, so that the reflection coefficient of these mirrors is increased.

Other materials may be used alternatively instead of silicon, for generating Cherenkov radiation, and a combination of silicon and molybdenum, for generating transition radiation. For example, transition radiation may also be generated in a multilayer medium consisting of nickel and carbon layers. This medium must then be bombarded with electrons having an energy of 18 MeV, corresponding to the energy level of the L absorption edge of nickel. This transition radiation is harder X-ray radiation having a wavelength of 1.46 nm and may be used, for example in X-ray microscopes or in other X-ray analysis apparatuses. The multilayer structures of these mirrors in these apparatuses preferably comprise carbon and consist of, for example, alternating layers of carbon and nickel.

It has hitherto been assumed that the materials of the medium 3 or 5 are pure materials with which radiation having a given intensity can be obtained. Since the intensity of the generated radiation is strongly dependent on the dispersion in the materials, the radiation output can be enhanced by changing the chemical composition of the medium material and hence the dispersion therein. Moreover, the wavelength of the generated radiation then also changes, which may sometimes be desirable in practice.

The intensity of the EUV radiation supplied by the radiation source unit may be further increased by passing this radiation up and down between a fully reflecting mirror and a mirror which exhibits some transmission to EUV radiation and passes this radiation to the other mirrors of the illumination system. On this basis, a laser can be made for EUV radiation.

Figure 6:
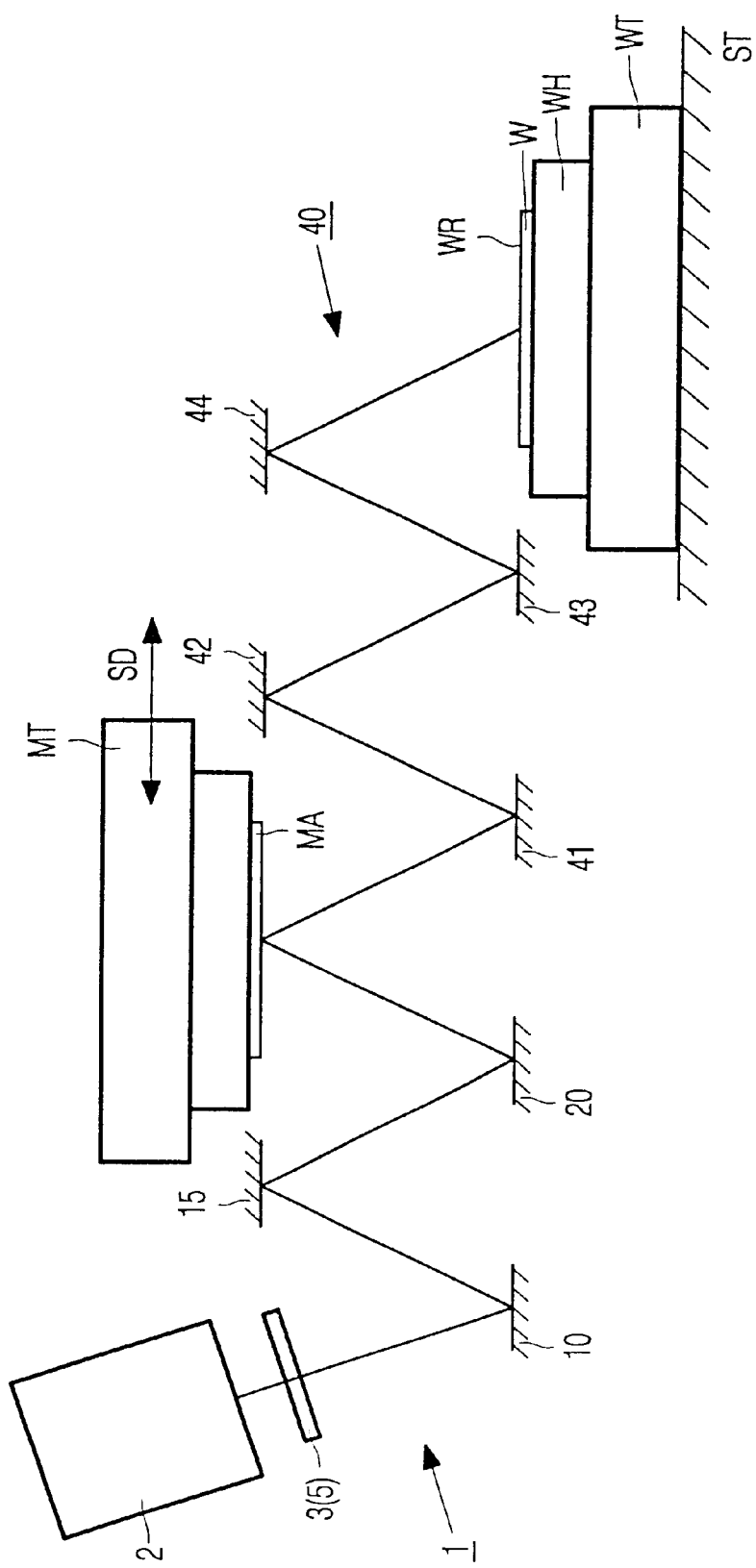
FIG. 6 shows an embodiment of a lithographic apparatus comprising the illumination system.

FIG. 6 shows an embodiment of a step-and-scanning lithographic projection apparatus comprising the novel illumination system for illuminating a mask MA, and a mirror projection system for imaging a mask pattern, present in this reflective mask, on a substrate W which is provided with a photoresist WR which is sensitive to EUV radiation. The illumination system shown in the left-hand part of the Figure is designed in known manner in such a way that it supplies an illumination beam IB which has a circular segment-shaped cross-section at the location of the mask. The mask MA is arranged in a mask holder MH which forms part of a mask table MT. By means of this table, the mask can be moved in the scan direction SD possibly in a second direction, perpendicular to the plane of the drawing, such that all areas of the mask pattern can be positioned under the radiation spot formed by the illumination beam. The mask table and mask holder are only shown diagrammatically and may be implemented in various ways. The substrate W to be illuminated is arranged on a substrate holder WH which is supported by a substrate table (stage) WT. This table can move the substrate in the scan direction SD but also in a direction perpendicular to the plane of the drawing. The substrate table is supported, for example by a stone ST. For further details of a step-and-scanning apparatus, reference is made by way of example to PCT patent application WO 97/33204 (PHQ 96004).

For imaging the mask pattern on the substrate with a reduction of, for example 4x, a mirror projection system 40 comprising, for example, four mirrors 41, 42, 43 and 44 is arranged between the mask and the substrate. For the sake of simplicity, these mirrors are shown as plane mirrors, but actually they are concave and convex mirrors and the mirror system is designed in such a way that the desired sharp image is realized at a reduction of, for example 4x. The design of the mirror projection system is not a subject of the present application. Analogously as the mirrors of the illumination system, each mirror 41, 42, 43 and 44 has a multilayer structure of first layers having a first refractive index, alternating with second layers having a second refractive index. According to the invention, the material of the first layers is equal to the material of the medium 3 if Cherenkov radiation is used, or the material of the first layers and the material of the second layers are equal to the materials of the multilayer medium 5 if transition radiation is used.

A transmissive mask instead of a reflective mask may be used alternatively. The first mirror 41 of the projection system would then be above the mask. The advantage of a reflection mask is that it can be satisfactorily provided on a stable and flat base, for example, by means of suction, so that this mask remains satisfactorily flat and stays in position.

Instead of four mirrors, the mirror projection system may alternatively have a different number of mirrors, for example, three, five or six. It generally holds that as the number of mirrors is larger, the accuracy of the image is better, but the radiation loss increases. Thus, a compromise will have to be found between the quality of the image and the radiation intensity on the substrate, which intensity also determines the throughput of the substrates through the apparatus. Mirror projection systems having three, five or six mirrors for lithographic apparatuses are known per se. For example, a six-mirror system is described in EP-A 0 779 528.

The mirror projection system is preferably designed in such a way that the free optical work distance, i.e. the distance between the last mirror of the system and the plane of the substrate is sufficiently large, so that optical sensors can be arranged in the space between this mirror and the substrate. Such sensors, which are already used in stepping apparatuses or in step-and-scanning apparatuses in which the projection system is a lens system, are, for example, a height and level sensor described in, for example, U.S. Pat.

No. 5,191,200 (PHQ 91007) and a frame sensor described in, for example, U.S. Pat. No. 5,144,363 (PHQ 90003).

The mirror projection system is preferably telecentric on the side of the substrate, which has the advantage that magnification errors due to unwanted movements in the Z direction of the substrate with respect to the projection system are prevented.

The EUV lithographic projection apparatus may not only be used in the manufacture of ICs but also in the manufacture of, for example, liquid crystalline display panels, integrated or planar optical systems, and magnetic heads.

The novel illumination system may not only be used in lithographic apparatuses but is generally applicable in optical systems in which EUV radiation is to be used for increasing, for example, the resolution of the relevant system to a considerable extent. Examples are EUV microscopes, EUV diagnostic apparatuses for, for example, medical applications, X-ray microscopes or X-ray analysis apparatus.

What is claimed is:

1. An illumination system for illuminating an object with EUV radiation, which system comprises an EUV radiation source unit and at least one EUV radiation-reflecting mirror having a multilayer structure of first layers of a first material alternating with second layers of a second material, characterized in that the radiation source unit is provided with a medium bombarded by an electron beam and a mask displaced from the medium, which medium comprises at least a material which is equal to one of the materials of said mirror.

2. An illumination system as claimed in claim 1, characterized in that the medium of the radiation source unit consists of a single material which emits Cherenkov (EUV) radiation upon electron beam bombardment.

3. An illumination system as claimed in claim 1, characterized in that the medium of the radiation source unit comprises a multilayer structure of said first and second materials which emits (EUV) transition radiation upon electron beam bombardment.

4. An illumination system as claimed in claim 2, characterized in that the medium consists of silicon, and in that the first and the second material of the mirror are silicon and molybdenum, respectively.

5. An illumination system as claimed in claim 3, characterized in that the materials of the medium are silicon and molybdenum.

6. A lithographic projection apparatus comprising an illumination system, a mask holder for accommodating a mask, a substrate holder for accommodating a substrate, and a mirror projection system for imaging a mask pattern, present in the mask, on the substrate, characterized in that the illumination system is a system as claimed in claim 1.

7. A lithographic projection apparatus as claimed in claim 6, characterized in that the mirrors of the mirror projection system have the same multilayer structure as the mirrors of the illumination system.

8. A method of manufacturing devices comprising the steps of:

providing at least one mask with a mask pattern representative of a structure layer of the device;

illuminating said at least one mask with EUV radiation, using an EUV radiation source and a mirror system comprising at least one EUV radiation reflecting mirror having a multi layer structure of first layers of a first material alternating with second layers of a second material;

protecting, by means of the EUV radiation, the said mask pattern onto an area of a substrate provided with a layer which is sensitive to the EUV radiation, in which area a device is to be formed, characterized in that for generating the EUV radiation an electron beam generator is used and the electron beam is made incident on a medium displaced from the at least one mask which comprises at least a material that is equal to one of said materials of said mirror.

9. The method of claim 8, characterized by the further step of displacing the mask and the substrate relative to each other and repeating the steps of providing the mask, illuminating the mask pattern and projecting the mask pattern are repeated until all suitable areas of the substrate are provided with an image of the mask pattern.

10. The method of claim 8, characterized in that the step of illuminating the mask pattern comprises illuminating the whole mask pattern area simultaneously.

11. The method of claim 8, characterized in that the step of scanning the mask pattern comprises scanning the mask pattern with an EUV radiation beam having, in the plane of the mask pattern an elongated cross-section the width of which is smaller than the mask pattern.

* * * * *